(12) United States Patent
Ma

(10) Patent No.: US 9,459,285 B2
(45) Date of Patent: Oct. 4, 2016

(54) TEST PROBE COATED WITH CONDUCTIVE ELASTOMER FOR TESTING OF BACKDRILLED PLATED THROUGH HOLES IN PRINTED CIRCUIT BOARD ASSEMBLY

(71) Applicant: GLOBALFOUNDRIES INC., Grand Cayman (KY)

(72) Inventor: Wai M. Ma, Poughkeepsie, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 297 days.

(21) Appl. No.: 13/938,688

(22) Filed: Jul. 10, 2013

(65) Prior Publication Data

US 2015/0015288 A1    Jan. 15, 2015

(51) Int. Cl.
G01R 1/067    (2006.01)
G01R 31/28    (2006.01)

(52) U.S. Cl.
CPC ....... G01R 1/06755 (2013.01); G01R 1/06738 (2013.01); G01R 31/2808 (2013.01)

(58) Field of Classification Search
None
See application file for complete search history.

(56) References Cited

U.S. PATENT DOCUMENTS

| | | | |
|---|---|---|---|
| 3,992,073 | A | 11/1976 | Buchoff et al. |
| 5,166,602 | A | 11/1992 | Byford et al. |
| 5,527,591 | A * | 6/1996 | Crotzer .................... H01H 1/06 428/209 |
| 5,600,099 | A * | 2/1997 | Crotzer ................ H01R 13/035 174/257 |
| 5,855,063 | A | 1/1999 | Schreiber et al. |
| 5,879,172 | A | 3/1999 | McKenna-Olson et al. |
| 5,949,029 | A * | 9/1999 | Crotzer ................... B32B 27/08 174/254 |
| 6,051,982 | A | 4/2000 | Alcoe et al. |
| 6,264,476 | B1 * | 7/2001 | Li ....................... G01R 1/06716 439/66 |
| 6,297,660 | B2 * | 10/2001 | Farnworth ............... 324/756.02 |
| 6,400,167 | B1 | 6/2002 | Gessford et al. |
| 6,423,905 | B1 | 7/2002 | Brodsky et al. |
| 6,538,213 | B1 | 3/2003 | Carden et al. |
| 6,702,587 | B2 | 3/2004 | Weiss et al. |
| 7,337,537 | B1 * | 3/2008 | Smetana, Jr. .......... H05K 3/429 29/846 |
| 7,538,565 | B1 | 5/2009 | Beaman et al. |

(Continued)

FOREIGN PATENT DOCUMENTS

JP    08-046311    2/1996

OTHER PUBLICATIONS

IPCOM000135653D: "Conductive Elastomeric Tipped Probe for Testing Fine Pitched Conductors" Disclosed Anonymously, Apr. 20, 2006, (four pages).

(Continued)

*Primary Examiner* — Paresh Patel
(74) *Attorney, Agent, or Firm* — David A. Cain, Esq.

(57) ABSTRACT

A test probe is provided for probing signal information on a back-drilled plated through hole connector formed in a printed circuit board, where the test probe includes a conductive probe body with a distal tip region extending a predetermined minimum coverage length ($L_{TIP}$) that is longer than a recess depth dimension ($D_{PL}$) for a recessed plating layer formed in the back-drilled plated through hole connector with an elastomer test probe tip formed around the distal tip region and having a total tip width ($W_{TIP}$) which is compressed when inserted into the recessed plating layer formed in a back-drilled plated through hole connector, thereby establishing a conductive path between the conductive probe body and the recessed plating layer.

7 Claims, 4 Drawing Sheets

(56) References Cited

U.S. PATENT DOCUMENTS

| | | | |
|---|---|---|---|
| 7,669,321 B1* | 3/2010 | Levy | H05K 1/0268 174/260 |
| 2004/0051541 A1 | 3/2004 | Zhou et al. | |
| 2005/0134298 A1 | 6/2005 | Campbell et al. | |
| 2008/0217052 A1* | 9/2008 | Matsui | H05K 1/0268 174/266 |
| 2009/0049414 A1 | 2/2009 | Mutnury et al. | |
| 2009/0111299 A1 | 4/2009 | Domitrovits et al. | |
| 2010/0052715 A1 | 3/2010 | Beaman et al. | |
| 2012/0298406 A1 | 11/2012 | Ma | |

OTHER PUBLICATIONS

Shaowei Deng et al., Effects of Open Stubs Associated with Plated Through-Hole Vias in Backpanel Designs, 2004 International Symposium on Electromagnetic Compatibility, vol. 3, Aug. 9-13, 2004, (six pages).

* cited by examiner

TEST PROBE COATED WITH CONDUCTIVE ELASTOMER FOR TESTING OF BACKDRILLED PLATED THROUGH HOLES IN PRINTED CIRCUIT BOARD ASSEMBLY

BACKGROUND

1. Field of the Invention

The present invention relates in general to integrated circuits. In one aspect, the present invention relates to a test probe apparatus for integrated circuit devices and methods of use thereof.

2. Description of the Related Art

In the fabrication of high performance electronic or electrical devices and circuits, integrated circuit components may be mounted onto a printed circuit or wiring boards by using plated through holes (PTH) via structures formed in the boards to provide power and/or signal conductors through the boards. Such PTH via structures may be formed by drilling or selectively etching holes in the board which are then coated or plated with one or more metal layers (e.g., copper) to form conductive paths and contact areas on the boards, devices and the like. While there are a variety of PTH via structure fabrication techniques that are well known and widely employed, different fabrication techniques that use different processing steps can form different types of PTH via structures which require specialized fabrication steps and/or probe test equipment, thereby adding to the cost and complexity of the manufacturing process and of the resultant products.

Accordingly, a need exists for an improved electronic device, method and system for mounting and testing such devices which addresses various problems in the art that have been discovered by the above-named inventor where various limitations and disadvantages of conventional solutions and technologies will become apparent to one of skill in the art after reviewing the remainder of the present application with reference to the drawings and detailed description which follow, though it should be understood that this description of the related art section is not intended to serve as an admission that the described subject matter is prior art.

BRIEF SUMMARY

Broadly speaking, selected embodiments of the present invention provide a system, method, and test probe apparatus for testing back-drilled plated through hole via structures in a printed circuit board assembly. In selected embodiments, a test probe includes a tip or distal end region on which is formed a conductive elastomer structure having predetermined geometric dimensions that are suitable for insertion into a back-drilled PTH via structure to make electrical contact with the remaining plating layer(s) in the PTH via structure. The conductive elastomer structure may be formed by spray coating the probe tip or distal end region with a conductive elastomer material, such as a metal impregnated polymer. By controlling the application of the spray coating process, the geometric dimensions of the conductive elastomer structure may be controlled to provide a minimum coverage length for the probe tip/distal end region and/or a specified thickness measure so that the width of the conductive elastomer structure will fit within the through-hole width while making electrical or "wiping" contact with the remaining plating layer(s) in the PTH via structure to provide a 360 degree surface of contact inside the PTH via structure.

In accordance with various embodiments, an electrical device is provided for probing signal information on a back-drilled plated through hole connector formed in a printed circuit board. The disclosed electrical device includes a conductive probe body on which is formed an elastomer test probe tip. The conductive probe body may include a distal tip region extending a predetermined minimum coverage length ($L_{TIP}$) that is controlled to be longer than a recess depth dimension ($D_{PL}$) for a recessed plating layer formed in a back-drilled plated through hole connector to be probed. In selected embodiments, the distal tip region of the conductive probe body has a surface finish (e.g., abraded or slotted) that is disposed to promote adhesion of the elastomer test probe tip. The disclosed elastomer test probe tip is formed around the distal tip region of the conductive probe body and has a total tip width ($W_{TIP}$) that is controlled to be compressed when inserted into the recessed plating layer formed in a back-drilled plated through hole connector to be probed, thereby establishing a conductive path between the conductive probe body and the recessed plating layer. In selected embodiments, the total tip width ($W_{TIP}$) of the elastomer test probe tip is controlled to be smaller than a first width measure ($W_{VIA}$) of a back-drilled plated through hole opening formed in the printed circuit board where the back-drilled plated through hole connector is located. In addition, the elastomer test probe tip may be formed with a spray-coated elastomer material including conductive particles dispersed throughout the elastomer material to provide a conductive path between the conductive probe body and the recessed plating layer when inserted and compressed into contact with the back-drilled plated through hole connector. In other embodiments, the elastomer test probe tip may be formed with a spray-coated elastomer material formed with a mixture of melted rubber, metal particles, and a volatile solvent. In yet other embodiments, the elastomer test probe tip may be formed with a metal impregnated polymer formed to a uniform thickness around sides of the distal tip region such that the metal impregnated polymer is conductive when compressed by the recessed plating layer formed in a back-drilled plated through hole connector, and is not conductive when not compressed by the recessed plating layer formed in a back-drilled plated through hole connector. In still yet other embodiments, the elastomer test probe tip may be formed with an electrically conductive polymer film impregnated with carbon or silver.

In another form, there is provided a method of probing a back-drilled plated through hole in a printed circuit board. In the disclosed methodology, a conductive elastomer tip structure is formed on a conductive test probe, where the conductive elastomer tip structure has a predetermined geometry and total width dimension that is suitable for insertion into a back-drilled plated through hole to make electrical contact with a back-drilled plating layer in the back-drilled plated through hole. In selected embodiments, the conductive elastomer tip structure is formed by spray coating a metal impregnated elastomer material on a distal tip region of the conductive test probe to form a conformal layer having a total tip width that is controlled to be compressed when inserted into the back-drilled plating layer in the first back-drilled plated through hole to be probed, thereby establishing a conductive path between the conductive test probe and a back-drilled plating layer in the first back-drilled plated through hole. As formed, the distal tip region of the conductive test probe may be formed to have a surface finish to promote adhesion between the conductive elastomer tip structure and the conductive test probe. In other embodiments, the conductive elastomer tip structure is formed to extend over a distal tip region of the conductive test probe by a predetermined minimum coverage length ($L_{TIP}$) that is controlled to be longer than a recess depth dimension ($D_{PL}$) for a back-drilled plating layer in the back-drilled plated through hole. In yet other embodiments, the conductive elastomer tip structure is formed by spray coating an elastomer spray solution including a mixture of melted rubber, metal particles, and a volatile solvent. For example, the elastomer spray solution may be applied to a distal tip region of the conductive test probe using a rotational spray pattern for a predetermined duration to form the conductive elastomer tip structure with a conformal layer having a uniform thickness around the distal tip region. The conductive elastomer tip structure and part of the conductive test probe may be inserted into a first back-drilled plated through hole of a printed circuit board to make electrical contact between the conductive test probe and a back-drilled plating layer in the first back-drilled plated through hole.

In yet another form, there is provided a method of probing a back-drilled plated through hole in a printed circuit board. In the disclosed methodology, a printed circuit board is provided that includes a first back-drilled plated through hole to be probed. As formed, the first back-drilled plated through hole includes a recessed plating layer recessed within a through hole via having a first via width dimension ($W_{VIA}$) by a recess depth dimension ($D_{PL}$). The test probe is positioned in alignment with the first back-drilled plated through hole. As formed, the test probe includes a conductive elastomer test probe tip structure formed on a distal tip region of the test probe to have a predetermined minimum coverage length and a predetermined maximum total thickness, where predetermined minimum coverage length is controlled to be longer than the recess depth dimension ($D_{PL}$), and where the predetermined maximum total thickness is controlled to be smaller than the first via width dimension ($W_{VIA}$). After being positioned in alignment, the test probe is inserted into the first back-drilled plated through hole so that the conductive elastomer test probe tip structure makes contact with a surface of the recessed plating layer in the first back-drilled plated through hole, thereby establishing a conductive path between the test probe and the first back-drilled plated through hole. By inserting the test probe, a surface of the recessed plating layer in the first back-drilled plated through hole is wiped to remove a surface oxide on the recessed plating layer when the conductive elastomer test probe tip structure contacts the surface of the recessed plating layer. In addition, the insertion of the test probe may compress the conductive elastomer test probe tip structure with the recessed plating layer formed in the first back-drilled plated through hole so that conductive particles in the conductive elastomer test probe tip structure are compressed together to form an electrical path between the recessed plating layer and the test probe. In other embodiments, the conductive elastomer test probe tip structure is formed with conductive particles that are dispersed within the conductive elastomer test probe tip structure that do not form an electrical path through the conductive elastomer test probe tip structure unless the conductive elastomer test probe tip structure is compressed against the recessed plating layer formed in the first back-drilled plated through hole connector. In other embodiments, the inserted test probe includes a metal impregnated polymer formed to a uniform thickness around sides of the distal tip region such that the metal impregnated polymer is conductive when compressed by the recessed plating layer formed in the first back-drilled plated through hole, and is not conductive when not compressed by the recessed plating layer formed in a first back-drilled plated through hole connector. In yet other embodiments, the inserted test probe includes a spray coated elastomer material comprising conductive particles dispersed throughout the elastomer material to provide a conductive path between the test probe and the recessed plating layer when inserted and compressed into contact with the recessed planting layer in the first back-drilled plated through hole.

BRIEF DESCRIPTION OF THE SEVERAL VIEWS OF THE DRAWINGS

The present invention may be better understood, and its numerous objects, features and advantages made apparent to those skilled in the art by referencing the accompanying drawings. The use of the same reference number throughout the several figures designates a like or similar element.

DETAILED DESCRIPTION

Figure 1:
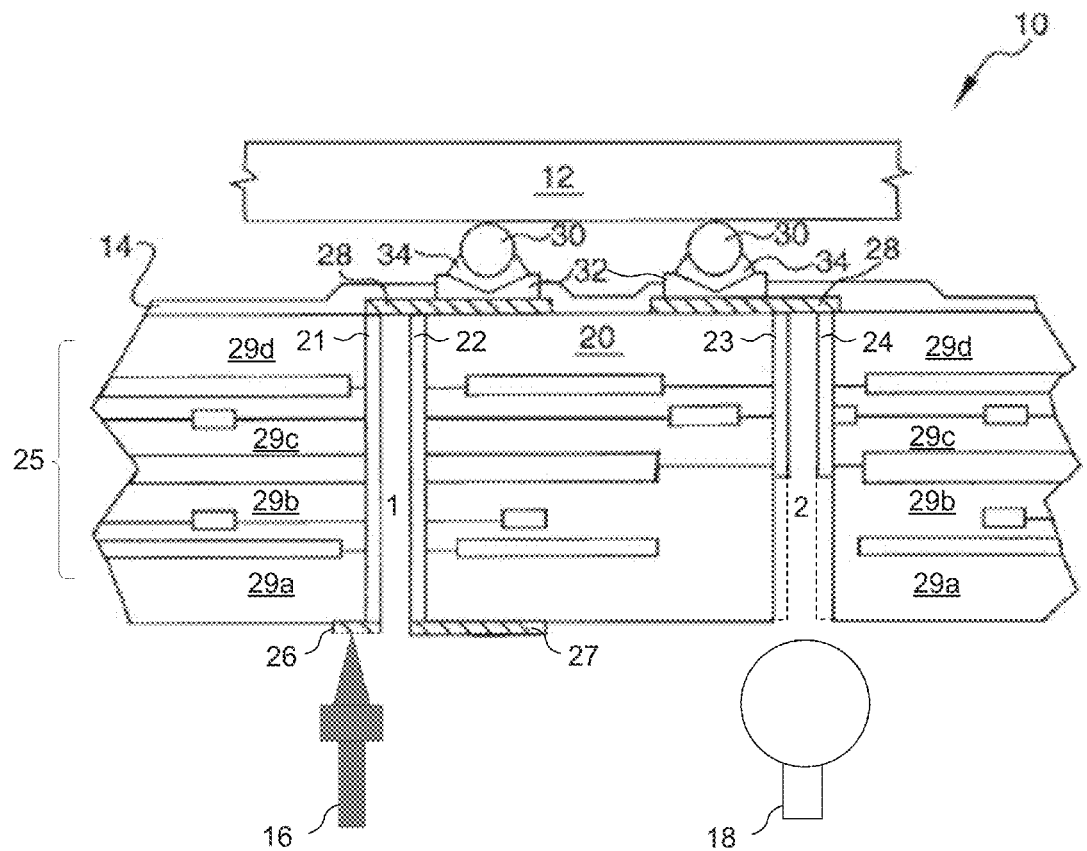
FIG. 1 illustrates a partial cross-sectional view of electronic package with a semiconductor chip is mounted onto a circuitized substrate carrier having plated through hole conductors for electronically interconnecting the semiconductor chip to external circuits.

A high performance test probe having a conductive elastomer tip and associated methodology of fabrication and/or operation are described for testing printed circuit board assemblies having back-drilled plated through holes. In selected embodiments, a test probe includes a flexible or elastic tip structure having predetermined geometric shape dimensions and conductive properties that are suitable for insertion into a back-drilled plated through hole to make electrical contact with back-drilled plating layer(s) in the plated through hole. The elastic tip structure may be formed by spray coating or molding a conductive elastomer material, such as a metal impregnated polymer, on the tip or distal end region of a probe. In selected embodiments, the elastic tip structure may be formed with a chemically bonded conductive or non-conductive polymer matrix containing conductive particles which are positioned and dispersed throughout the polymer matrix to provide a conductive path from the remaining back-drilled plating layer(s) to the probe when inserted and compressed into contact with the back-drilled plating layer(s). In other embodiments, the conductive particles are positioned and dispersed in the polymer matrix so that the conductive particles do not electrically contact one another when the elastic tip structure is not compressed and so that there is no conductive path through the uncompressed elastic tip structure. And by properly controlling the formation of the elastic tip structure to meet predetermined geometric dimension requirements, the width of the elastic tip structure is suitably dispose to fit within a specified through-hole width while making electrical or "wiping" contact with the remaining back-drilled plating layer(s) in the plated through hole(s). In this way, the elastic tip structure may be positioned to provide a contact wiping action during insertion into the plated through hole without damaging or scratching the remaining back-drilled plating layer(s) inside the plated through hole.

Various illustrative embodiments of the present invention will now be described in detail with reference to the accompanying figures. While various details are set forth in the following description, it will be appreciated that the present invention may be practiced without these specific details, and that numerous implementation-specific decisions may be made to the invention described herein to achieve the device designer's specific goals, such as compliance with process technology or design-related constraints, which will vary from one implementation to another. While such a development effort might be complex and time-consuming, it would nevertheless be a routine undertaking for those of ordinary skill in the art having the benefit of this disclosure. For example, selected aspects are depicted with reference to simplified cross sectional drawings of an electronic device without including every device feature or geometry in order to avoid limiting or obscuring the present invention. Such descriptions and representations are used by those skilled in the art to describe and convey the substance of their work to others skilled in the art. In addition, although specific example materials are described herein, those skilled in the art will recognize that other materials with similar properties can be substituted without loss of function.

Referring now to FIG. 1, there is shown a partial cross-sectional view of an electronic package 10 in which a semiconductor chip 12 is mounted onto a circuitized substrate carrier 14 (e.g., a printed circuit board) which includes a multilayer interconnect structure 20 with plated through hole conductors 21-24 and contact pads 26-28 for electronically interconnecting the semiconductor chip 12 through the printed circuit board 14 to circuit elements and traces 25 in the PCB 14 and/or to external circuits, such as one or more test probe devices 16, 18. The semiconductor chip 12 is attached for electrical communication to the circuitized substrate carrier with a plurality of microvias or contact members 30 (e.g., solder connections) and contact pads 32 which are in electrical contact with a plurality of electrically conductive connectors 28 formed on the circuitized substrate carrier 14. For each microvia contact member 30, a layer of electrically conductive material 34 (e.g., copper, conductive paste or solder) may be applied to attach and electrically connect the microvia contact member 30 to the contact pads 32. For example, a pattern of solder connections 34 may be formed to match the pattern of microvia contact members 30 on semiconductor chip 12. In turn, each patterned conductor of electrically conductive material 34 is formed to make electrical contact with a contact pad 28 corresponding to a plated through hole or through-via 1, 2 formed in the circuitized substrate carrier 14.

As shown in FIG. 1, the circuitized substrate carrier 14 may be formed as a multilayer interconnect structure 20 having alternating layers of dielectric and conductive materials to define the circuit elements and traces 25. As will be appreciated, any desired circuitized substrate carrier 14 may be used, such as a conventional printed wiring board substrate having layers of glass reinforced epoxy laminate 29a-d to encapsulate various layers of circuitry formed with circuit elements and traces 25. The various layers of circuitry in the circuitized substrate carrier 14 are electrically interconnected to one another and to the semiconductor chip 12 by the plated through hole or through-via 1, 2 which may be formed by drilling holes (e.g., with a laser drill) that intersect the circuit features that are to be connected and then plating the walls of the holes with conductive plating layers 21-24 to form electrical connections. As formed, the conductive plating layers 21-24 connect the various layers of circuitry in the circuitized substrate carrier 14 with the contact pads 26-28 formed on the front and back exterior surfaces of the circuitized substrate carrier 14. The exterior surface metal used to form the contact pads 26-28 may be patterned to provide lands surrounding the plated through holes (e.g., 1) which are larger than the diameters of the holes. In this way, selected ones of the microvia contact members 30 may be provided with a direct electrical path through the circuitized substrate carrier 14 by using a plated through hole or through-via (e.g., PTH 1) to connect the semiconductor chip 12 across a respective microvia contact member 30, solder connection 34, contact pad 32, contact pad 28, PTH planting layers 21-22, and landing contact pads 26-27. The direct electrical path from a microvia contact member 30 to the landing contact pads 26-27 provides a relatively short and efficient electrical path for electrical signals to be transmitted from the semiconductor chip 12 through the multilayer interconnect structure 20 and to the outside environment. With this direct electrical path, test probe devices (e.g., 16, 18) may be applied to the landing contact pads 26-27 to probe the semiconductor chip 12 and/or any of the various layers of circuitry in the circuitized substrate carrier 14 that are interconnected to the plated through hole or through-via 1.

FIG. 1 also shows that aback-drilled plated through hole/via 2 may be formed by removing unused portions of the plated through hole conductor layers 23-24 (indicated with dashed lines) which form stubs that can create potential signal integrity problems, signal delays, and other undesired electrical effects. For example, when plated through hole or through-via structures in a multi-layered printed circuit board include unused lengths of the PTH via structure 2 in a signal path (indicated with dashed lines) which are not connected to any circuit elements and traces 25 in the PCB 14, the unused portion of the PTH via structure 2 can behave as a transmission line open stub in parallel with the signal transmission path. To remove stubs from PTH via structures, back drilling may be employed to remove extraneous plating layers from the PTH via structures that are not connected to the internal wiring of the circuitized substrate carrier 14. Back drilling can be implemented using any desired technique, such as by drilling openings in the bottom of the PCB 14 having a radius slightly larger than the via opening (e.g., 2) to drill out and remove the conductive plating layers 23-24 from the bottom portion of the PTH 2, thereby reducing the length of the stab and the resonance effects on signals. Unfortunately, the removal the stub also severs the electrical conductive path in the PTH via structure that is used for probe testing of the printed circuit board assembly. As shown in FIG. 1, the undrilled PTH 1 still provides the direct electrical path that is needed for probe testing (e.g., with probe device 16), but because the back-drilled PTH 2 no longer provides an electrical path connection that can be used by the probe device (e.g., 18), the traditional method of probing the bottom surface of the circuitized substrate carrier 14 that is directly opposite the mounted semiconductor chip 12 is no longer possible. Existing solutions for probe testing back-drilled PTH via structures impose additional cost and complexity (e.g., by requiring boundary scan circuits in the PCB), limit the ability to detect interconnect defects (until after boundary scan testing is performed), and/or require specialized test probes having spring geometry contacts that can damage the back-drilled PTH. Another challenge with existing probe test solutions is that contact end of the probe devices 16, 18 are not configured to penetrate into the back-drilled PTH and mike contact with the back-drilled plating layers 23-24. For example, while either of the test probes 16-18 are suitable for making electrical contact with the landing contact pads 26-27 for the first PTH 1, neither can be used with the second PTH 2. In particular, the first test probe 16 is narrow enough for partial insertion into the PTH 2, but is not long enough to make electrical contact with the back-drilled plating layers 23-24. In addition, the second test probe 18 is too wide to be inserted into the PTH 2 and cannot make electrical contact with the back-drilled plating layers 23-24.

Figure 2:
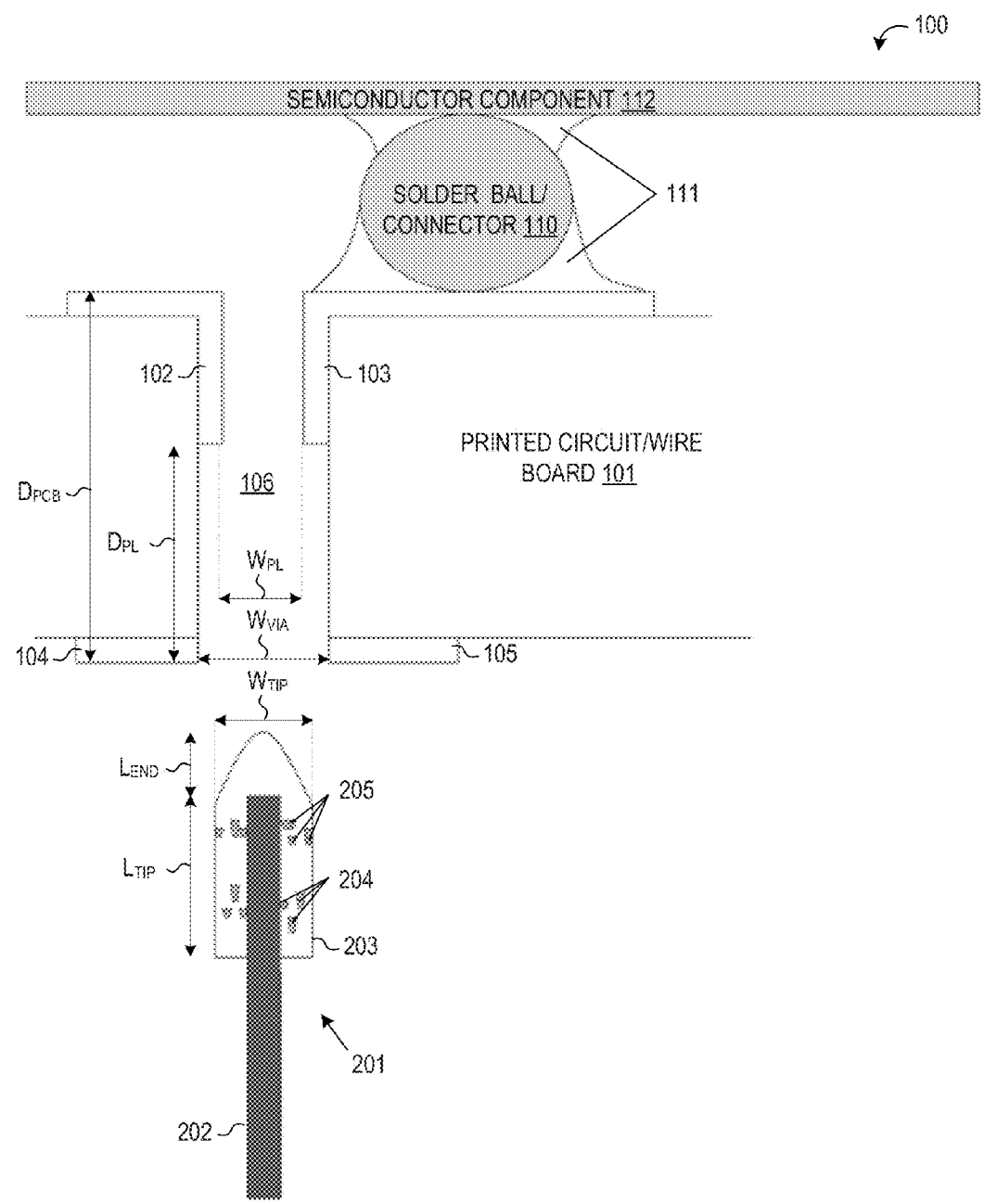
FIG. 2 illustrates a partial cross-sectional view of a test probe device having a conductive elastomer test probe tip that is positioned for insertion into a back-drilled plated through hole via in accordance with selected embodiments of the present invention.

To illustrate selected embodiments of the present invention, reference is now made to FIG. 2 which illustrates a partial cross-sectional view 100 of a test probe device 201 having a conductive elastomer test probe tip 203 that is positioned for insertion into a back-drilled plated through hole via 106 formed in a printed circuit or wire board 101. As illustrated, a semiconductor component 112 may be mounted onto the printed circuit/wire board 101 using any desired conductor and attachment mechanism, such as solder ball conductors or other connectors 110 which are electronically attached and connected with one or more layers of electrically conductive material 111 (e.g., copper, conductive paste or solder) to plated through hole conductors and/or contact pads 103 formed on the printed circuit or wire board 101.

The printed circuit/wire board 101 is formed with one or more layers of dielectric and conductive materials to form a substrate carrier. Though not shown, it will be appreciated that the printed circuit/wire board 101 may be a multilayer circuitized substrate in which various layers of circuitry are formed with circuit elements and other conductive traces. In the printed circuit/wire board 101, one or more plated through holes or through-vias 106 are formed, such as by laser drilling holes or via openings and then plating the walls of the openings with conductive plating layers 102-105 to form electrical connections on the top and bottom surfaces of the printed circuit/wire board 101 and on the interior walls of the openings. Subsequently, back-drilling is applied to form the back-drilled plated through hole via 106. The resulting back-drilled plated through hole via 106 is defined by a plurality of geometric dimensional measures, including a recess depth dimension ($D_{PL}$) which is a predetermined percentage of the total depth ($D_{PCB}$) of the printed circuit/wire board 101. As will be appreciated, the specified depth dimensions $D_{PL}$, $D_{PCB}$ may be measured from the bottom of the contact pads 104-105 as shown, from the bottom of the printed circuit/wire board 101 (not shown), or in any desired manner. The geometric dimensional measures of the back-drilled plated through hole via 106 may also include a first width dimension ($W_{PL}$) of the total width between the remaining PTH plating layers 102, 103, and a second width dimension ($W_{VIA}$) of the total width of the back-drilled via opening formed in the printed circuit/wire board 101. By definition, the second width dimension ($W_{VIA}$) is larger than the first width dimension ($W_{PL}$) by a difference that is equal to or greater than the combined thickness of the PTH plating layers 102, 103. By using controllable fabrication processes (such as photolithographic pattern in combination with timed etch chemistries and laser-controlled back-drilling operations) to form the printed circuit or wire board 101, the plurality of geometric dimensional measures defining the back-drilled plated through hole via 106 may be maintained within specified tolerance measures for the various width and depth measures, thereby providing consistent and repeatable feature dimensions for the back-drilled plated through hole via 106.

With reference to the feature dimensions for the back-drilled plated through hole via 106, the electrical test probe device 201 is provided with a conductive elastomer test probe tip 203 having predetermined geometric dimensions to fit within the width ($W_{VIA}$) of the plated through hole via 106 while making electrical or "wiping" contact with the remaining plating layer(s) 102-103. The conductive elastomer test probe tip 203 is secured at one end of the probe body 202 using any desired attachment mechanism. For example, the conductive elastomer test probe tip 203 may be formed by spray coating or molding a conductive elastomer material, such as a metal impregnated polymer, on the tip or distal end region of the probe body 202. To promote adhesion, the surface of the tip or distal end region of the probe body 202 may be abraded or slotted to promote engagement with the conductive elastomer material 203. In selected embodiments, the conductive elastomer test probe tip 203 may be formed with a chemically bonded conductive or non-conductive polymer matrix containing conductive particles 204, 205 which are positioned and dispersed throughout the polymer matrix 203 to provide a conductive path when compressed into contact with one another, but to otherwise not provide a conductive path when uncompressed (as shown in FIG. 2). For example, the conductive elastomer test probe tip 203 may be formed with conductive particles 204-205 (e.g., silver or other metal) that are grafted to or dispersed within a conductive or non-conductive polymer substrate material 203, such as by spraying a slurry or elastomer spray solution consisting of a mixture of melted rubber or other elastomer material (to provide elasticity or resilience, metal particles (to provide electrical conductive paths), and volatile solvent (to reduce viscosity during spraying) to a (predetermined thickness around the probe body 202. For example, a slurry containing conductive particles can be molded, screen printed, or rotationally sprayed around the tip or distal end region of the probe body 202 to form the conductive elastomer test probe tip 203. In other embodiments, the conductive elastomer test probe tip 203 may be formed by molding or extruding a conductive etastomer material, such as a metal impregnated polymer, to cover the tip or distal end region of the probe body 202. Though the conductive elastomer test probe tip 203 is shown as having a limited number of conductive particles 204, 205 formed in the polymer matrix 203, it will be appreciated that any desired quantity of conductive particles may positioned or dispersed in the polymer matrix 203 with sufficiently proximity to each other to provide a desired level of conductivity or non-conductivity, as the case may be.

However formed, the geometric dimensions of the conductive elastomer test probe tip 203 may be controlled to provide a minimum coverage length for the probe tip/distal end region ($L_{TIP}$) which may also include a specified end length ($L_{END}$) for an extension of the conductive elastomer test probe tip 203 past the end of the end of the probe body 202. In selected embodiments, the minimum coverage length for the probe tip/distal end region ($L_{TIP}$) should be larger than the recess depth dimension ($D_{PL}$) of the back-drilled plated through hole via 106. In addition, the geometric dimensions of the conductive elastomer test probe tip 203 are controlled to provide a specified thickness measure so that the total width ($W_{TIP}$) or diameter measure of the conductive elastomer test probe tip 203 is smaller than the through via diameter or width dimension ($W_{VIA}$), but larger than the plated through via diameter or width dimension ($W_{PL}$). Stated differently, $W_{PL} < W_{TIP}$ in selected embodiments where the difference between $W_{PL}$ and $W_{TIP}$ defines the amount of lateral compression required to form a conductive path from the dispersed conductive particles in the conductive elastomer test probe tip 203. In other embodiments where compression of the conductive elastomer test probe tip 203 is not required to form a conductive path therein, $W_{PL} \leq W_{TIP} \leq W_{VIA}$. In yet other embodiments where compression of the conductive elastomer test probe tip 203 is required to form a conductive path therein, $W_{PL} < W_{TIP} < W_{VIA}$. In this way, the conductive elastomer test probe tip 203 will fit within the through-hole width ($W_{VIA}$) while making electrical or "wiping" contact with the remaining plating layer(s) 102-103 which are separated by the plating layer separation width ($W_{PL}$) to provide a 360 degree contact surface with the PTH via structure 106. By using controllable fabrication processes (such as a timed, rotational spray pattern to form the conductive elastomer test probe tip 203), the geometric dimensional measures defining the conductive elastomer test probe tip 203 may be maintained within specified tolerance measures for the various width and length measures, thereby providing consistent and repeatable feature dimensions for the elastomer test probe tip 203.

Figure 3:
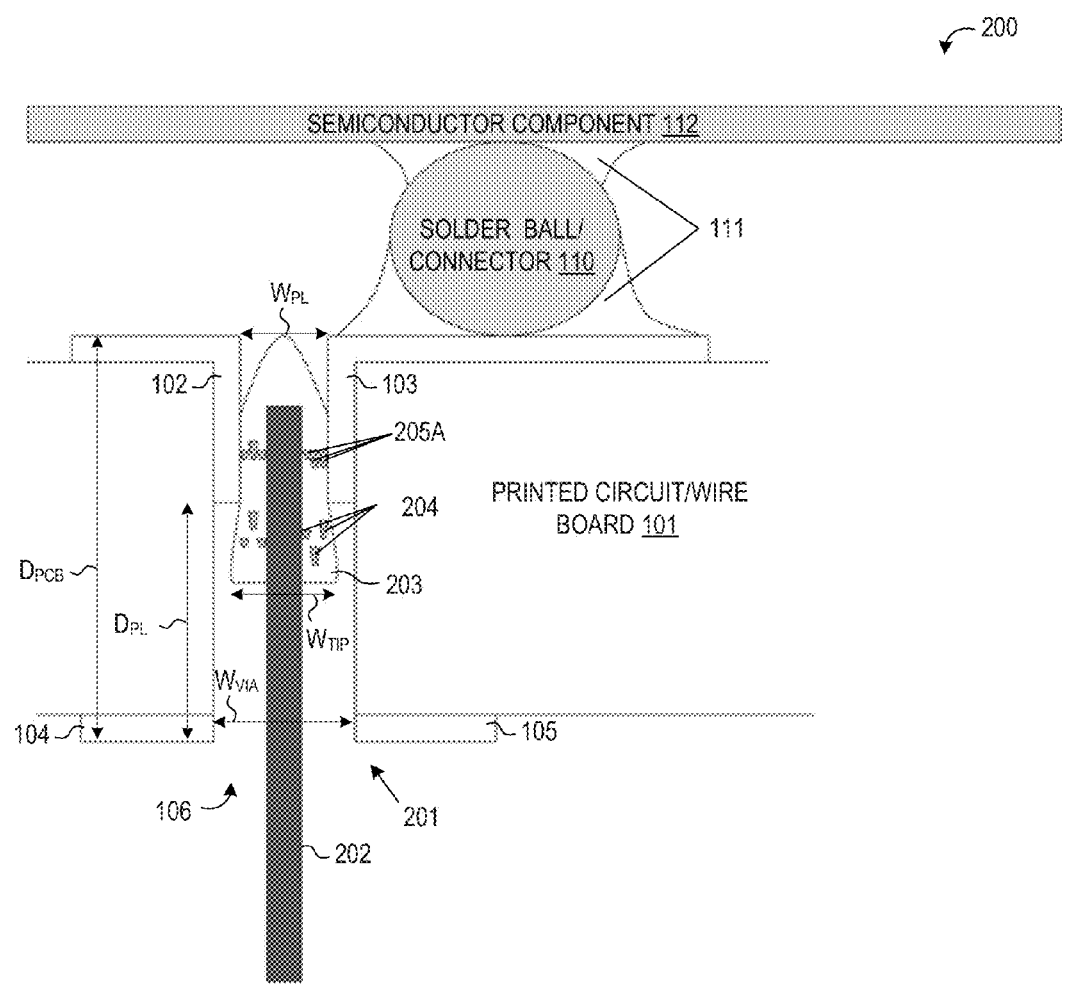
FIG. 3 illustrates a partial cross-sectional view of a test probe device having a conductive elastomer test probe tip that is fully inserted into a back-drilled plated through hole via formed in the board to make electrical contact with the plating layer(s) in accordance with selected embodiments of the present invention.

To illustrate how the compression of conductive elastomer test probe tip 203 forms a conductive path from the back-drilled plating layers 103 to the test probe device 201, reference is now made to FIG. 3 which shows illustrates a partial cross-sectional view 200 of the test probe device 201 with the conductive elastomer test probe tip 203 that is partially or fully inserted into the back-drilled plated through hole via 106 formed in the printed circuit/wire board 101. In selected embodiments where the total width ($W_{TIP}$) of the conductive elastomer test probe tip 203 is larger than the plating layer separation width ($W_{PL}$), the conductive particles 205A in the compressed portion of the conductive elastomer test probe tip 203 are pressed together with the compressed polymer matrix 203 to provide a conductive path from the back-drilled plating layers (e.g., 103) to the probe body 202. In this way, electrical continuity is established when the conductive particles 205A in the metal impregnated elastomer 203 touch or contact one another in the compressed area. However, in the uncompressed area, the conductive particles 204 in the metal impregnated elastomer 203 do not touch or contact one another, so there is no electrical path formed.

Figure 4:
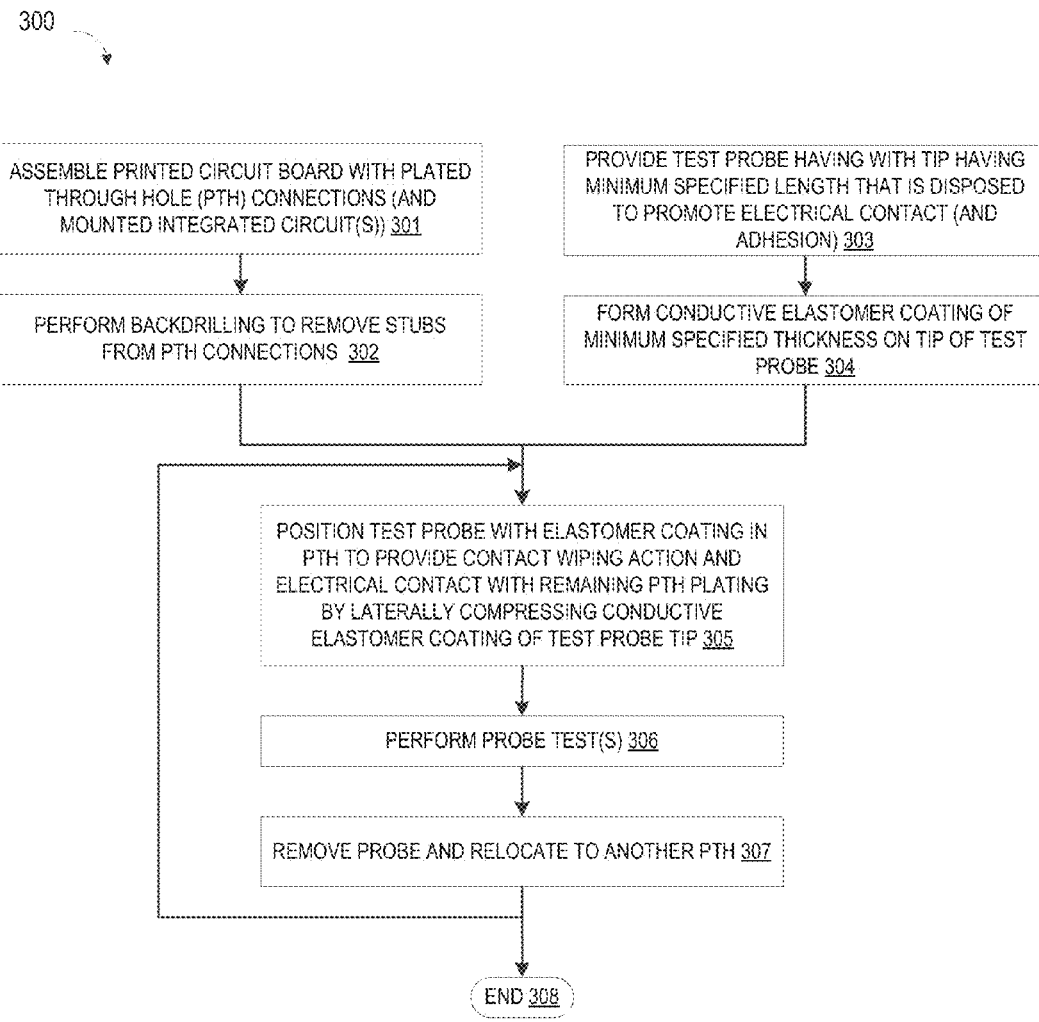
FIG. 4 illustrates a flow diagram fir a design and manufacturing sequence for fabricating and/or using a test probe device having a conductive elastomer test probe tip to test a printed circuit or wiring board assembly in accordance with selected embodiments of the present invention.

Turning now to FIG. 4, there is shown a flow diagram for a design and manufacturing sequence 300 for fabricating and/or using a test probe device having a conductive elastomer test probe tip for testing a printed circuit or wiring board assembly in accordance with selected embodiments of the present invention. In selected embodiments, the sequence may begin at step 301 during an initial design and/or fabrication of a printed circuit board assembly. At this point, plated through hole connections are formed in the printed circuit board, alone or in combination with one or more mounted integrated circuits. As described herein, the plated through holes may be formed by drilling holes (e.g., with a laser drill) in the printed circuit board, and then plating the walls of the holes with conductive plating layers to form plated through hole connections.

At step 302, the plated through hole connections are back drilled to remove any unused portions of the plated through hole connections (or stubs) and to leave remnant plating layers in the plated through holes. As described herein, back drilling may be performed by drilling the bottoms of the plated through hole connections with back-drilled openings having a radius that is slightly larger than the radius of the originally drilled holes to drill out and remove the plating layers from the bottom portion of the printed circuit board, thereby reducing the length of the stub and thus reduce the resonance effects on signals. However, since the back-drilled PTH connections are defined by one or more recess depth dimensions ($D_{PL}$), the back-drilled PTH connections no longer provide a path of electrical continuity through the entire width of the printed circuit board that can be used with conventional test probe devices.

To account for the recessed nature of the back-drilled plating layers, a test probe device is provided at step 303. In selected embodiments, the test probe may include a conductive probe body having a tip or distal end region with a minimum specified length that is disposed to promote electrical contact with the back-drilled plating layers. To this end, the minimum specified length of the tip or distal end region ($L_{TIP}$) should be larger than the recess depth dimension ($D_{PL}$) of the back-drilled PTH connection. In other embodiments, the tip or distal end region of the test probe may be disposed to promote adhesion with a subsequently formed conductive elastomer coating, such as by including an abraded or roughened or slotted surface to promote engagement with the conductive elastomer material.

At step 304, a conductive elastomer coating or structure is formed on the tip or distal end of the test probe. As described herein, the tip of the test probe may be coated with a resilient electrical conductive elastomer that will make contact with the remaining plating layers in the back-drilled PTH connection. An example of an electrical conductive polymer film is a carbon or silver impregnated silicone compound. By exposing the minimum specified length of the test probe tip to a rotating spray coating of conductive elastomer spray solution consisting of a mixture of melted rubber, metal particles, and a volatile solvent, the test probe tip may be uniformly coated with a controlled thickness of conductive elastomer coating so that the total width ($W_{TIP}$) of the conductive elastomer test probe tip is larger than the plating layer separation width ($W_{PL}$).

At step 305, the elastomer-coated test probe is positioned in the back-drilled PTH connection to establish electrical contact between the test probe and the remaining plating layers in the back-drilled PTH connection. In selected embodiments, the compressive properties of the conductive elastomer coating provides a normal or compressive force when inserted into contact with the back-drilled plating layers inside the PTH connection that is necessary to make adequate electrical contact. By controlling the width of the conductive elastomer coating/structure on the test probe tip ($W_{TIP}$) to be larger than the plating layer separation width ($W_{PL}$), the elastomer-coated test probe provides a contact wiping action when the test probe is inserted into the back-drilled PTH connection where it will make contact with the remaining plating layers. The wiping action of the probe insertion will remove copper oxidation from the back-drilled plating layers to create a clean contact area.

At step 306, one or more probe tests are performed with the elastomer-coated test probe positioned and inserted for electrical contact with the back-drilled PTH connection. By controlling the geometric dimensions of the elastomer-coated test probe, the probe can enter into the back drilled PTH connection to make electrical contact with the back-drilled plated layers. With this testing configuration, any component mounting defects on the printed circuit board assembly caused by the assembly process can be detected using current in-circuit testing methodologies. In this way, cost savings in labor time and assembly cycle time can be achieved with early detection of defects in manufacturing. Another advantage is that the resilient tip of the elastomer-coated test probe will provide a contact wiping action during insertion into the back-drilled PTH without damaging or scratching the plating layers inside the back-drilled PTH connection. In addition, the cylindrical shape of the rotationally sprayed test probe tip will provide a 360 degree surface of contact inside the back-drilled PTH connection.

At step 307, the test probe is removed and may be relocated to test another back-drilled PTH connection. In this way, a single test probe configuration may be used in manual testing of the back-drilled PTH connection. Alternatively, the test probe configuration described herein may be arranged into multiple probe array pattern for use in performing in-circuit testing (ICT) of the PCB. At step 308, the fabrication and test sequence ends or repeats as necessary.

While the present invention has been described with respect to certain preferred embodiments, it will be understood that numerous modifications, changes, and improvements may be made without departing from the spirit and scope of the invention its broadest form.

The invention claimed is:

1. An electrical device for probing signal information on a back-drilled plated through hole connector formed in a printed circuit board, the electrical device comprising:
    a conductive probe body comprising a distal tip region extending a predetermined minimum coverage length ($L_{TIP}$) that is controlled to be longer than a recess depth dimension ($D_{PL}$) for a recessed plating layer formed in a back-drilled plated through hole connector to be probed; and
    an elastomer test probe tip formed annularly around the distal tip region of the conductive probe body and having a total tip width ($W_{TIP}$) that is wider than a width of the conductive probe body and controlled to be compressed when the distal tip region of the conductive probe body is inserted into the recessed plating layer formed in a back-drilled plated through hole connector to be probed so as to establish a conductive path between the conductive probe body and the recessed plating layer.

2. The electrical device of claim 1, the distal tip region of the conductive probe body having a surface finish that is disposed to promote adhesion of the elastomer test probe tip.

3. The electrical device of claim 1, the total tip width ($W_{TIP}$) of the elastomer test probe tip being controlled to be smaller than a first width measure of a back-drilled plated through hole opening formed in the printed circuit board where the back-drilled plated through hole connector is located.

4. The electrical device of claim 1, the elastomer test probe tip comprising a spray coated elastomer material comprising conductive particles dispersed throughout the spray coated elastomer material to provide a conductive path between the conductive probe body and the recessed plating layer when inserted and compressed into contact with the back-drilled plated through hole connector.

5. The electrical device of claim 1, the elastomer test probe tip comprising a spray coated elastomer material comprising a mixture of melted rubber, metal particles, and a volatile solvent.

6. The electrical device of claim 1, the elastomer test probe tip comprises a metal impregnated polymer formed to a uniform thickness around sides of the distal tip region such that the metal impregnated polymer is conductive when compressed by the recessed plating layer formed in a back-drilled plated through hole connector, and is not conductive when not compressed by the recessed plating layer formed in a back-drilled plated through hole connector.

7. The electrical device of claim 1, where the elastomer test probe tip comprises an electrically conductive polymer film impregnated with carbon or silver.

* * * * *